US011467268B2

(12) United States Patent
Lin et al.

(10) Patent No.: US 11,467,268 B2
(45) Date of Patent: Oct. 11, 2022

(54) OPTICAL PROXIMITY SENSOR WITH SELF-COMPENSATION FOR AMBIENT LIGHT AND CROSSTALK USING LIGHT-TO-FREQUENCY CONVERSION TECHNIQUE

(71) Applicants: Dyna Image Corporation, New Taipei (TW); Lite-On Semiconductor Corporation, Taipei (TW)

(72) Inventors: Wen-Sheng Lin, New Taipei (TW); Sheng-Cheng Lee, New Taipei (TW); Yu-Cheng Su, New Taipei (TW); Peng-Han Chan, New Taipei (TW); Chun-Hsien Lin, New Taipei (TW)

(73) Assignees: Dyna Image Corporation, New Taipei (TW); Lite-On Semiconductor Corporation, Taipei (TW)

( * ) Notice: Subject to any disclaimer, the term of this patent is extended or adjusted under 35 U.S.C. 154(b) by 780 days.

(21) Appl. No.: 16/449,398

(22) Filed: Jun. 23, 2019

(65) Prior Publication Data

US 2020/0363513 A1 Nov. 19, 2020

(30) Foreign Application Priority Data

May 17, 2019 (CN) .......................... 201910411710.6

(51) Int. Cl.
| | |
|---|---|
| *G01S 7/487* | (2006.01) |
| *G01S 7/481* | (2006.01) |
| *G01S 17/10* | (2020.01) |
| *H03M 1/74* | (2006.01) |

(52) U.S. Cl.
CPC .......... *G01S 7/4876* (2013.01); *G01S 7/4816* (2013.01); *G01S 17/10* (2013.01); *H03M 1/74* (2013.01)

(58) Field of Classification Search
CPC ...... G01S 7/4876; G01S 7/4816; G01S 17/10; G01S 7/4861; H03M 1/74; G01V 8/12; H01L 27/3269; H01L 41/113; H01L 41/1132; H01L 2224/76753
See application file for complete search history.

(56) References Cited

U.S. PATENT DOCUMENTS 10,330,822 B2 * 6/2019 Lee .......................... G01V 8/12

* cited by examiner

*Primary Examiner* — Thanh Y. Tran
(74) *Attorney, Agent, or Firm* — JCIPRNET

(57) ABSTRACT

Disclosures of the present invention describe an optical proximity sensor, which is particularly designed to have functionality of canceling an ambient light noise and/or an optical crosstalk noise by using light-to-frequency conversion technique, and comprises: a controlling and processing circuit, a lighting unit, a light receiving unit, an analog adder, a first DAC unit, a second DAC unit, and a light-to-digital conversion (LDC) unit. In the controlling of the controlling and processing circuit, the first DAC unit and the second DAC unit would respectively generate a first compensation current signal and a second compensation current signal to the analog adder, such that a noise signal of ambient light and a noise signal of optical crosstalk existing in an optical current signal of object reflection light would be canceled by the two compensation current signals in the analog adder.

11 Claims, 3 Drawing Sheets

OPTICAL PROXIMITY SENSOR WITH SELF-COMPENSATION FOR AMBIENT LIGHT AND CROSSTALK USING LIGHT-TO-FREQUENCY CONVERSION TECHNIQUE

BACKGROUND OF THE INVENTION

1. Field of the Invention

The present invention relates to the technology field of optical proximity sensors, and more particularly to an optical proximity sensor with self-compensation for ambient light and crosstalk using light-to-frequency conversion technique.

2. Description of the Prior Art

With the high development of smart phones, mobile phones are not limited to be a simple communication tool anymore, especially there are more and more advanced application units such as AR (Augmented Reality) and VR (Virtual Reality) integrated in the smart phones. Nowadays, the smart phone has become a necessary electronic device for everyone. There are several sensors known to be disposed in a commercial smart phone, including fingerprint sensor, ambient light sensor, optical proximity sensor, G-sensor, accelerometer, magnetism sensor, gyroscope, and global positioning system (GPS).

In a commercial smart phone, an optical proximity sensor (PS) and an ambient light sensor (ALS) are commonly integrated in an identical optical sensing module. To further explain the functionality of the optical proximity sensor, when a user puts his smart phone in close proximity corresponds to his ear, the optical proximity sensor would inform a main controlling circuitry of the smart phone to switch off a touch screen of the smart phone for preventing user's face from accidentally touching the touch screen. It is worth further explaining that, the optical proximity sensor can also be applied in other technology fields, including non-contact type electronic switch, limit switch, tamper detection, and Time of Flight (ToF). For example, AirPods, one kind of wireless Bluetooth earbuds created by Apple, Inc., has equipped with a non-contact type electronic switch for being as a proximity sensor so as to determine whether the earbuds is in user's ears or not.

Please refer to FIG. 1, where a cross-sectional diagram of a package structure of a conventional optical sensing module is provided. As FIG. 1 shows, the optical sensing module 2' comprises: a circuit substrate 21', a lighting element 22', a light receiving element 23', and a controlling and processing unit, wherein the lighting element 22' and the light receiving element 23' are accommodated in a packaging housing 26' having a light inlet opening LRO' and a light outlet opening LOO'.

During operation of the optical sensing module 2', the lighting elements 22' is controlled to emit a detection light 31' to an object 3', such that the receiving element 23' receives a first reflective light 32' coming from the object 3'. In the meantime, the receiving element 23' would simultaneously receive a second reflective light coming from a cover plate 15' disposed over the packaging housing 26'. The cover plate 15' may be a sheet of glass or an acrylic plate according to the package type of the optical sensing module 2'. What is the most important is that, the received second reflective light 151' would become an optical crosstalk noise so as to cause the controlling and processing unit fail to correctly calculate a distance between the object 3' and the optical sensing module 2'.

There are many technology solutions developed and disclosed for canceling the optical crosstalk noise. U.S. Patent Publication No. 2014/0252212 and U.S. Patent Publication No. 2018/0203101 disclosed different optical sensing circuits that are able to cancel the optical crosstalk noise by using particularly-designed circuit topologies. On the other hand, U.S. Patent Publication No. 2016/0356642 cancels the optical crosstalk noise by changing the structure of the packaging housing 26'.

However, in spite of the fact that the three solutions can indeed be implemented to cancel the optical crosstalk noise, they still fail to cancel the influence of ambient light (sunlight) on the optical sensing module 2'. The primary reason is that the intensity of the ambient light is commonly far greater than that of the optical crosstalk (i.e., the second reflective light 151') and the first reflective light 32'. On the other hand, engineers skilled in development and manufacture of the optical proximity sensors (PS) should know that, an optical barrier is adopted by the U.S. Publication No. 2016/0356642 to block the optical crosstalk (i.e., the second reflective light 151') from being received by the light receiving element 23'. However, owing to the fact that the optical barrier commonly has a certain height, causing that the whole thickness of the packaging housing cannot be controlled to be in a range of 0.75-1 mm. Therefore, it is foreseeable that, the optical sensing module 2' that has the packaging housing 26' provided with the optical barrier therein is hard to satisfy with the requirements of light weight and small volume demanded by people on current portable electronic devices. However, if there is no optical barrier provided in the packaging housing 26', optical crosstalk noise certainly lead the optical sensing module 2' to work abnormally, such that electronic engineers must develop and implement specific circuit topology and/or algorithm into the optical sensing module 2' for canceling the noises of optical crosstalk and ambient light (sunlight).

From above descriptions, it is clear how to cancel the noises of optical crosstalk and ambient light simultaneously and effectively has become the most important issue. In view of that, inventors of the present application have made great efforts to make inventive research and eventually provided an optical proximity sensor with self-compensation for ambient light and crosstalk using light-to-frequency conversion technique.

SUMMARY OF THE INVENTION

The primary objective of the present invention is to disclose an optical proximity sensor, which is particularly designed to have functionality of canceling an ambient light noise and/or an optical crosstalk noise by using light-to-frequency conversion technique, and comprises: a controlling and processing circuit, a lighting unit, a light receiving unit, an analog adder, a first DAC unit, a second DAC unit, and a light-to-digital conversion (LDC) unit. In the controlling of the controlling and processing circuit, the first DAC unit and the second DAC unit would respectively generate a first compensation current signal and a second compensation current signal to the analog adder, such that a noise signal of ambient light and a noise signal of optical crosstalk existing in an optical current signal of object reflection light would be canceled by the two compensation current signals in the analog adder. Particularly, the LDC unit is configured for firstly converting an analog current signal that is outputted by the analog adder to a pulse frequency modulated signal, so as to subsequently output a signal for providing a pulse number to the controlling and processing circuit. Consequently, the controlling and processing circuit is able to completely remove two types of noise signals from the optical current signal of object reflection light based on the pulse number and a particularly-designed mathematic equation.

In order to achieve the primary objective of the present invention, the inventor of the present invention provides an embodiment for the optical proximity sensor, which is particularly-designed to have functionality of canceling an ambient light noise and/or an optical crosstalk noise by using light-to-frequency conversion technique, and comprises:

a controlling and processing circuit;
a lighting unit, being electrically connected to the controlling and processing circuit, so as to emit a detection light to an object based on a driving signal generated by the controlling and processing circuit;
a light receiving unit, being configured for receiving an object reflection light reflected from the object, and correspondingly generating a optical current signal of the object reflection light;
an analog adder, being coupled to the light receiving unit;
a first digital-to-analog conversion (DAC) unit, being electrically connected to the controlling and processing circuit, so as to generate a first compensation current signal after receiving a first DAC controlling signal from the controlling and processing circuit;
a first switch, being coupled between the first DAC unit and the analog adder;
a second digital-to-analog conversion (DAC) unit, being electrically connected to the controlling and processing circuit, so as to generate a second compensation current signal after receiving a second DAC controlling signal from the controlling and processing circuit;
a second switch, being coupled between the second DAC unit and the analog adder; and
a light-to-digital conversion (LDC) module, being electrically connected to the analog adder for receiving an analog current signal, and comprising:
a light-to-frequency conversion (LFC) unit, being adopted for converting the analog current signal to a pulse frequency modulated signal; and
a pulse counter, being adopted for applying a pulse counting process to the pulse width modulation signal, and subsequently outputting a signal for providing a pulse number to the controlling and processing circuit;
wherein the controlling and processing circuit controls the first switch and the second switch to respectively form a first open circuit and a second open circuit during an power-off period of the lighting unit, so as to make the analog adder output the analog current signal after receiving the optical current signal of the object reflection light;
wherein the controlling and processing circuit controls the first switch and the second switch to respectively form a first short circuit and a second short circuit during an power-on period of the lighting unit, such that the analog adder simultaneously receives the first compensation current signal, the second compensation current signal and the optical current signal of the object reflection light, and then correspondingly outputting the analog current signal.

In one embodiment of the optical proximity sensor, both the first DAC controlling signal and the second DAC controlling signal are a binary code signal.

In one embodiment of the optical proximity sensor, the first DAC unit has a first resolution of n, and the second DAC unit having a second resolution of m that is greater than n.

In one embodiment of the optical proximity sensor, the controlling and processing circuit controls the first DAC unit to generate at least two of the first compensation current signals to the analog adder.

In one embodiment of the optical proximity sensor, the controlling and processing circuit is provided with a ratio calculator therein, and the ratio calculator is configured for calculating an average value of input bit for activating the first DAC unit to generate at least two of the first compensation current signals.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an optical proximity sensor with self-compensation for ambient light and crosstalk using light-to-frequency conversion technique disclosed by the present invention, embodiments of the present invention will be described in detail with reference to the attached drawings hereinafter.

Figure 1:
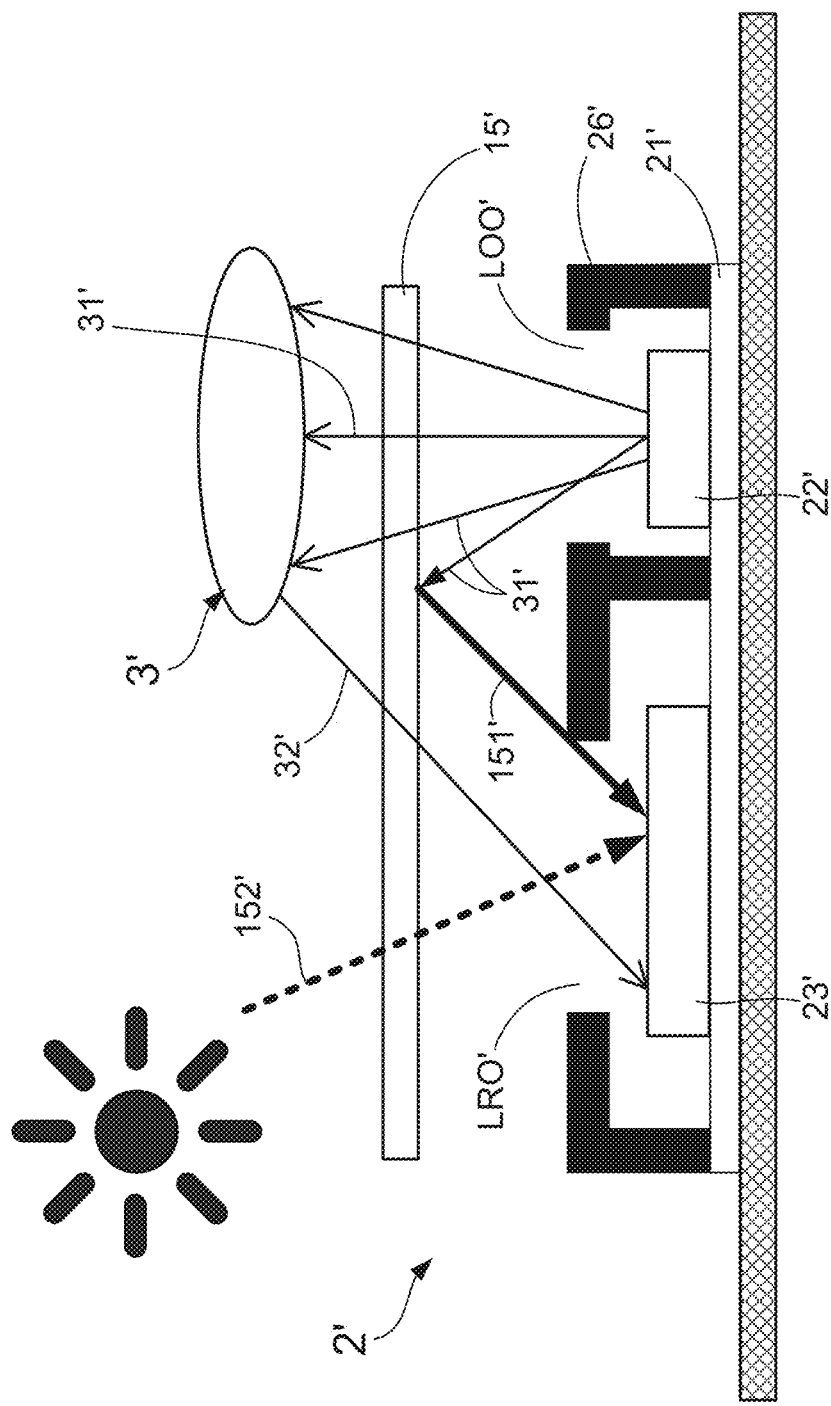
FIG. 1 shows a cross-sectional diagram of a package structure of a conventional optical sensing module.
Figure 2:
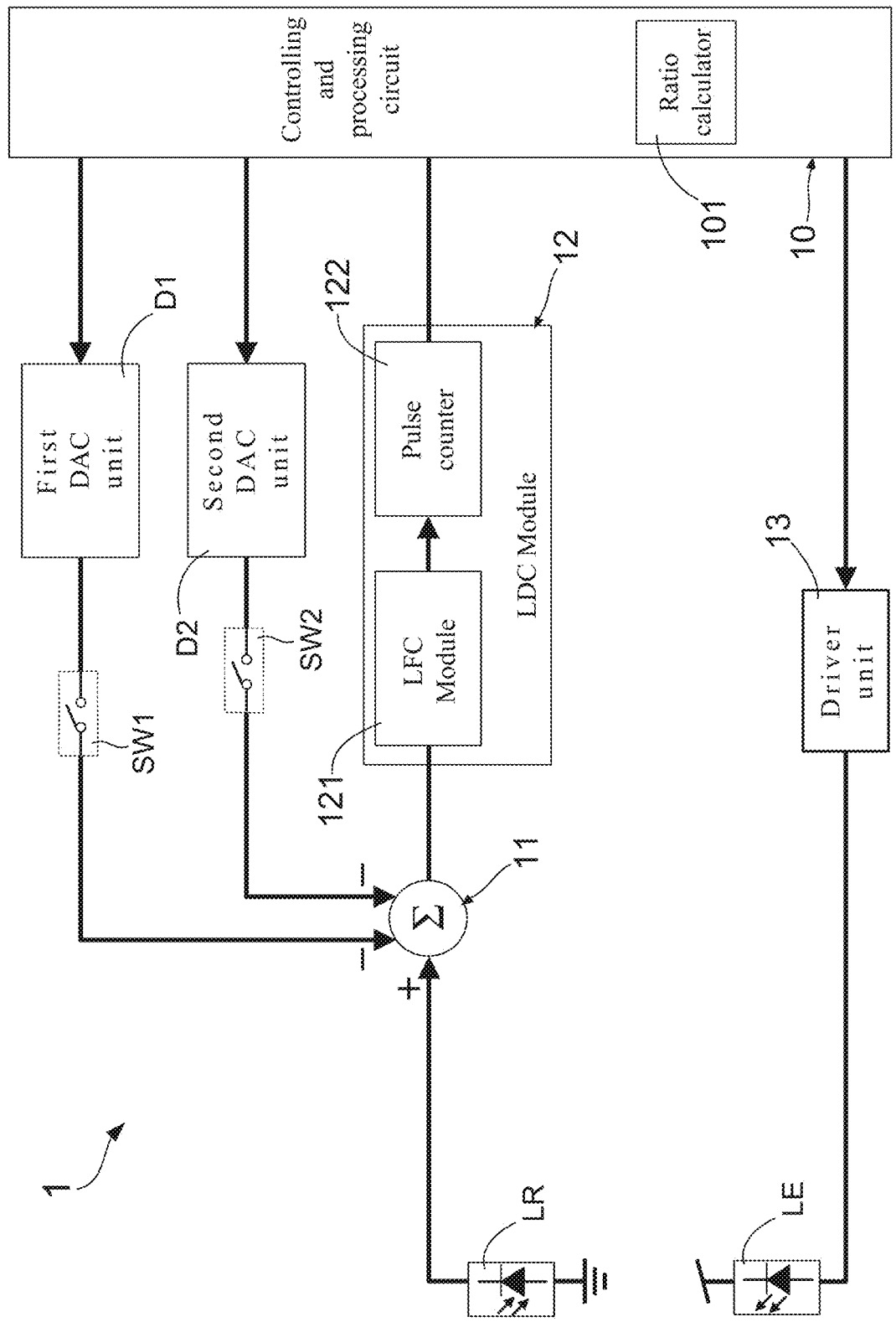
FIG. 2 shows a block diagram of an optical proximity sensor with self-compensation for ambient light and crosstalk using light-to-frequency conversion technique according to the present invention.

With reference to FIG. 2, there is shown a block diagram of an optical proximity sensor with self-compensation for ambient light and crosstalk using light-to-frequency conversion technique according to the present invention. As FIG. 2 shows, the optical proximity sensor 1 is particularly designed to have functionality of canceling an ambient light noise and/or an optical crosstalk noise by using light-to-frequency conversion technique. Herein, it needs to firstly emphasize that, the optical proximity sensor 1 of the present invention can be made as a signal electronic chip or component, and can also be integrated with an ambient light sensor (ALS) so as to form an optical sensing device. Moreover, this optical proximity sensor 1 can be further applied in other technology fields, including non-contact type electronic switch, limit switch, tamper detection, and Time of Flight (ToF).

The optical proximity sensor 1 of the present invention comprises: a controlling and processing circuit 10, a lighting unit LE, a light receiving unit LR, an analog adder 11, a first digital-to-analog conversion (DAC) unit D1, a first switch SW1, a second digital-to-analog conversion (DAC) unit D2, a second switch SW2, a light-to-digital conversion (LDC) module 12, and a driver unit 13. In which, the driver unit 13 is coupled between the controlling and processing circuit 10 and the lighting unit LE, and is adopted for driving the lighting unit LE to emit a detection light to an object based on a driving signal of the controlling and processing circuit 10. The light receiving unit LR is configured for receiving an object reflection light reflected from the object, and correspondingly generates an optical current signal of the object reflection light.

In general, conventional technology such as U.S. Patent Publication No. 2014/0252212 adopts an analog-front-end (AFE) circuit to convert the foregoing optical current signal of the object reflection light to a voltage signal. In addition, since there are a noise signal of ambient light and a noise signal of optical crosstalk existing in the optical current signal of the object reflection light, the conventional technology further utilize a voltage comparator to apply a voltage comparison process between the voltage signal and a pre-setting threshold voltage, so as to complete a compensation for removing the two types of noise signals from the optical current signal of the object reflection light. Differently, in the present invention, an analog adder 11, a first DAC unit D1, a second DAC unit D2, and a light-to-digital conversion (LDC) module 12 are firstly arranged in one optical proximity sensor 1, so as to make the optical proximity sensor 1 has functionality of canceling an ambient light noise and/or an optical crosstalk noise in the case of using light-to-frequency (LFC) conversion technique.

Figure 3:
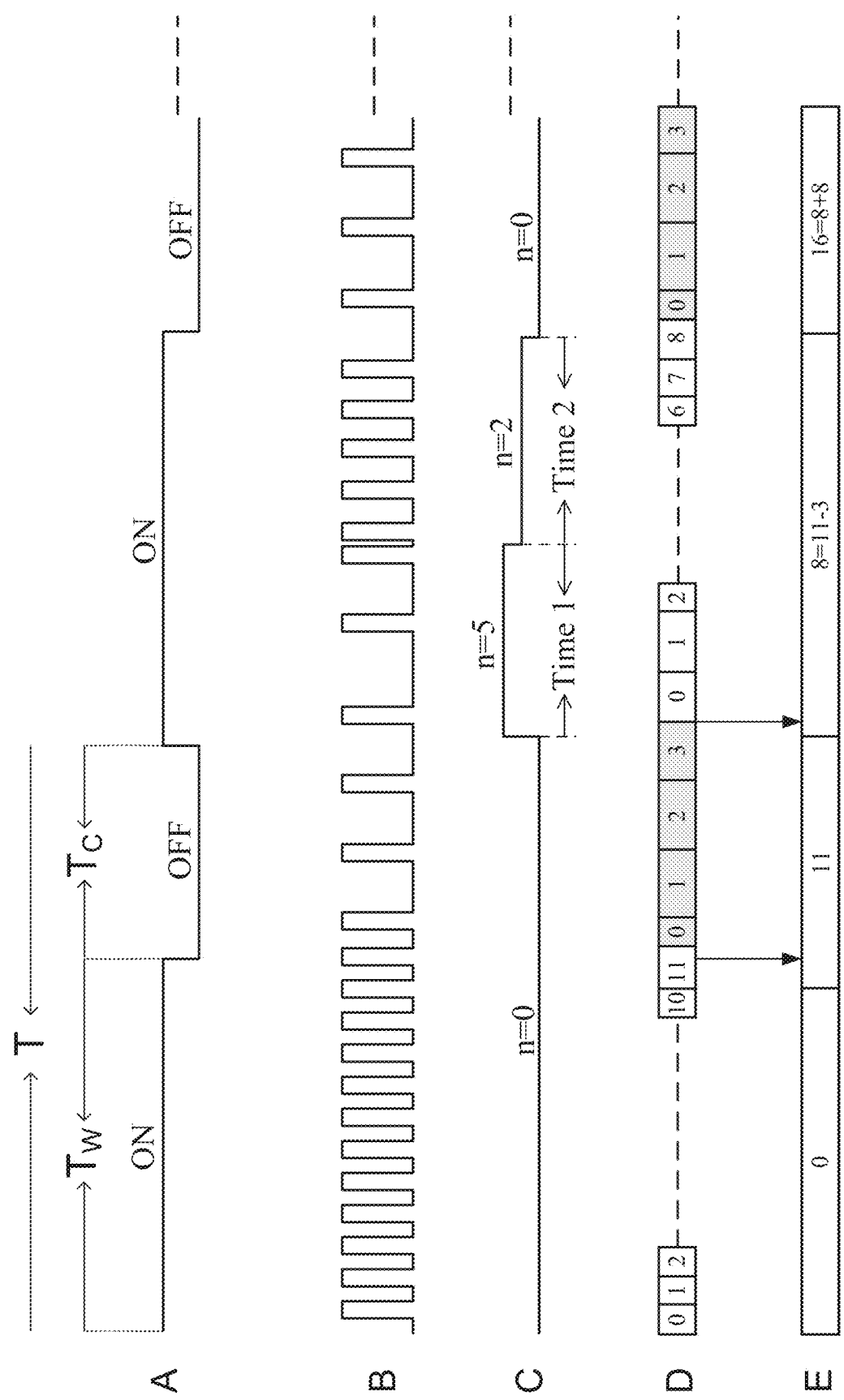
FIG. 3 shows a waveform graph for depicting several signals.

From FIG. 2, it is clear that the analog adder 11 is coupled to the light receiving unit LR, and the first DAC unit D1 is electrically connected to the controlling and processing circuit 10, and is configured for generating a first compensation current signal after receiving a first DAC controlling signal from the controlling and processing circuit 10. Moreover, there is a first switch SW1 coupled between the first DAC unit D1 and the analog adder 11. On the other hand, the second DAC unit D2 is electrically connected to the controlling and processing circuit 10, so as to generate a second compensation current signal after receiving a second DAC controlling signal from the controlling and processing circuit 10. In addition, there is a second switch SW2 coupled between the second DAC unit D2 and the analog adder 11. According to the particular design of the present invention, both the first DAC unit D1 and the second DAC unit D2 are a current steering digital-to-analog converter, and both the first DAC controlling signal and the second DAC controlling signal are a binary code signal. Herein, it is worth explaining that, the second compensation current signal generated by the second DAC unit D2 is used for canceling the noise signal of ambient light in the analog adder 11, and the first compensation current signal outputted by the first DAC unit D1 is utilized for canceling the noise signal of optical crosstalk in the analog adder 11. In such premise, the present invention further sets the first DAC unit D1 has a first resolution of n, and sets the second DAC unit D2 has a second resolution of m that is greater than n FIG. 3 shows a waveform graph for depicting several signals. In FIG. 3, signal A is the driving signal for driving the lighting unit LE, signal B is a pulse frequency modulated signal outputted by the light-to-frequency conversion (LFC) unit 121, signal C is the first compensation current signal outputted by the first DAC unit D1, signal D is a signal that is outputted by the pulse counter 122 for providing a pulse number to the controlling and processing circuit 10, and signal E is an output signal of the light-to-digital conversion (LDC) module 12.

According to the particular design of the present invention, the controlling and processing circuit 10 controls the lighting unit LE to be switched into a power-off mode, so as to measure an ambient light (sunlight) through the light receiving unit LR. As described in more detail below, the controlling and processing circuit 10 controls the first switch SW1 and the second switch SW2 to respectively form a first open circuit and a second open circuit during an power-off period of the lighting unit LE, such that the analog adder 11 receives the optical current signal of the object reflection light from the light receiving unit LR, and then outputs an analog current signal to the light-to-frequency conversion (LFC) unit 121. Therefore, from the signals A, B, and C, it is found that the LFC unit 121 is adopted for converting the analog current signal to a pulse frequency modulated signal, and the pulse counter 122 is configured for applying a pulse counting process to the pulse width modulation signal, so as to subsequently output a signal for providing a pulse number to the controlling and processing circuit 10. It is noted that FIG. 3 has revealed that the pulse number is 3. Of course, this value (i.e., 3) of the pulse number is calculated by the pulse counter 122, and this value is just an exemplary value for the pulse number, which is not used for forming a limitation for the pulse number.

On the other hand, the controlling and processing circuit 10 controls the first switch SW1 and the second switch SW2 to respectively form a first short circuit and a second short circuit during an power-on period of the lighting unit LE. From FIG. 3, it is found that the analog adder 11 simultaneously receives the first compensation current signal, the second compensation current signal and the optical current signal of the object reflection light, and then correspondingly outputs the analog current signal. It is noted that FIG. 3 has revealed that the pulse number is 11.

Therefore, because the controlling and processing circuit 10 is informed, by the LDC module 12, that the pulse number is 3, a calibration pulse number "8" can be derived by subtracting 3 from 11 during next power-on period of the lighting unit LE. It should know that, the way to subtract 3 from 11 is control the second DAC unit D2 to generate the second compensation current signal by a second DAC controlling signal with input bit m. Accordingly, during the second power-on period, the second DAC unit D2 is controlled to output the foregoing second compensation current signal. Simultaneously, the first DAC unit D1 is controlled by the controlling and processing circuit 10 so as to generate at least two of the first compensation current signals. It is worth to explaining that, the controlling and processing circuit 10 is particularly provided with a ratio calculator 101 therein, and the ratio calculator 101 is configured for calculating an average value of input bit for activating the first DAC unit D1 to generate at least two of the first compensation current signals. The average value of input bit is calculated by using following mathematic equation.

$$DAC(CT) = (DAC(CT1)*Time1 + DAC(CT2)*Time2)/(Time1+Time2)$$

For example, after receiving the binary code signal with the average value of input bit, the first DAC unit D1 output two first compensation current signals to the analog adder 11. FIG. 3 depicts that signal C comprises one first compensation current signal ($DAC_{(CT1)}$n=5) and another one first compensation current signal ($DAC_{(CT2)}$=2), wherein these two first compensation current signals have different amplitudes and the same signal outputting periods (Time 1=Time 2=5 μs). It is easily to calculate that the average value of input bit is calculated to $DAC_{(CT)}$=3.5. Briefly speaking, after the ratio calculator 101 calculates an average value of input bit, the controlling and processing circuit 10 would correspondingly control the first DAC unit D1 to generate at least two of the first compensation current signals with response to the average value of input bit. Herein, it needs to further explain that, a particular mathematic equation is developed by inventors of the present invention as follows: $N_{puC}*P_{puW}[T_W* L2F_{OUT}(DAC_{CT}=n, DAC_{AMB}=m)-T_C* L2F_{OUT}(DAC_{CT}=0, DAC_{AMB}=m)]$.

The particular mathematic equation is embedded in the controlling and processing circuit 10 for well controlling the canceling of the optical noises. In which Tw is the power-on period, Tc is the power-off period, Ppuw means the power of the pulse frequency modulated signal during the power-on period, NpuC is the pulse number of successively on/off of lighting unit LE, n is an input bit of the first DAC unit D1, and m is an input bit of the second DAC unit D2.

In summary, the optical proximity sensor 1 of the present invention utilizes the controlling and processing circuit 10, the second DAC unit D2, and the LDC module 12 to carry out the canceling of the ambient light noise during the power-off period of the lighting unit LE. Moreover, the optical proximity sensor 1 of the present invention further adopts the controlling and processing circuit 10, the first DAC unit D1, the second DAC unit D2, and the LDC module 12 to carry out the canceling of both the ambient light noise and the optical crosstalk during the power-on period of the lighting unit LE.

The above description is made on embodiments of the present invention. However, the embodiments are not intended to limit scope of the present invention, and all equivalent implementations or alterations within the spirit of the present invention still fall within the scope of the present invention.

What is claimed is:

1. An optical proximity sensor, having functionality of canceling an ambient light noise and/or an optical crosstalk noise by using light-to-frequency conversion technique, and comprising:
    a controlling and processing circuit;
    a lighting unit, being electrically connected to the controlling and processing circuit, so as to emit a detection light to an object based on a driving signal generated by the controlling and processing circuit;
    a light receiving unit, being configured for receiving an object reflection light reflected from the object, and correspondingly generating an optical current signal of the object reflection light;
    an analog adder, being coupled to the light receiving unit;
    a first digital-to-analog conversion (DAC) unit, being electrically connected to the controlling and processing circuit, so as to generate a first compensation current signal after receiving a first controlling signal from the controlling and processing circuit;
    a first switch, being coupled between the first DAC unit and the analog adder;
    a second digital-to-analog conversion (DAC) unit, being electrically connected to the controlling and processing circuit, so as to generate a second compensation current signal after receiving a second DAC controlling signal from the controlling and processing circuit;
    a second switch, being coupled between the second DAC unit and the analog adder; and
    a light-to-digital conversion (LDC) module, being electrically connected to the analog adder for receiving an analog current signal, and comprising:
        a light-to-frequency conversion (LFC) unit, being adopted for converting the analog current signal to a pulse frequency modulated signal; and
        a pulse counter, being adopted for applying a pulse counting process to the pulse width modulation signal, and subsequently outputting a signal for providing a pulse number to the controlling and processing circuit;
    wherein the controlling and processing circuit controls the first switch and the second switch to respectively form a first open circuit and a second open circuit during an power-off period of the lighting unit, so as to make the analog adder output the analog current signal after receiving the optical current signal of the object reflection light;
    wherein the controlling and processing circuit controls the first switch and the second switch to respectively form a first short circuit and a second short circuit during an power-on period of the lighting unit, such that the analog adder simultaneously receives the first compensation current signal, the second compensation current signal and the optical current signal of the object reflection light, and then correspondingly outputting the analog current signal.

2. The optical proximity sensor of claim 1, wherein both the first DAC controlling signal and the second DAC controlling signal are a binary code signal.

3. The optical proximity sensor of claim 1, wherein the first DAC unit has a first resolution of n, and the second DAC unit having a second resolution of m that is greater than n.

4. The optical proximity sensor of claim 2, wherein the controlling and processing circuit controls the first DAC unit to generate at least two of the first compensation current signals to the analog adder.

5. The optical proximity sensor of claim 4, wherein the controlling and processing circuit is provided with a ratio calculator therein, and the ratio calculator being configured for calculating an average value of input bit for activating the first DAC unit to generate at least two of the first compensation current signals.

6. The optical proximity sensor of claim 4, wherein the at least two of the first compensation current signals have different amplitudes and different signal outputting periods.

7. The optical proximity sensor of claim 4, wherein the at least two of the first compensation current signals have different amplitudes and the same signal outputting periods.

8. The optical proximity sensor of claim 1, further comprising:
    a driver unit, being coupled between the controlling and processing circuit and the lighting unit, and being adopted for driving the lighting unit to emit the detection light based on the driving signal of the controlling and processing circuit.

9. The optical proximity sensor of claim 1, wherein both the first DAC unit and the second DAC unit are a current steering digital-to-analog converter.

10. The optical proximity sensor of claim 1, wherein the controlling and processing circuit is made as a microprocessor, and the lighting unit comprises at least one lighting element that is selected from the group consisting of light-emitting diode and organic light-emitting diode.

11. The optical proximity sensor of claim 1, wherein the optical proximity sensor (PS) and an ambient light sensor (ALS) are integrated together so as to form an optical sensing device.

* * * * *